United States Patent
Ku

(10) Patent No.: US 7,855,570 B2
(45) Date of Patent: Dec. 21, 2010

(54) SEMICONDUCTOR DEVICE FOR PERFORMING MOUNT TEST IN RESPONSE TO INTERNAL TEST MODE SIGNALS

(75) Inventor: Kie-Bong Ku, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 265 days.

(21) Appl. No.: 12/005,305

(22) Filed: Dec. 27, 2007

(65) Prior Publication Data

US 2008/0174317 A1 Jul. 24, 2008

(30) Foreign Application Priority Data

Dec. 27, 2006 (KR) ...................... 10-2006-0134300
Sep. 28, 2007 (KR) ...................... 10-2007-0098270

(51) Int. Cl.
*G01R 31/26* (2006.01)
(52) U.S. Cl. ...................... 324/763; 324/765
(58) Field of Classification Search ...................... None
See application file for complete search history.

(56) References Cited

U.S. PATENT DOCUMENTS

| | | | |
|---|---|---|---|
| 5,796,745 A | 8/1998 | Adams et al. | |
| 5,969,929 A * | 10/1999 | Kleveland et al. | 361/111 |
| 6,360,344 B1 | 3/2002 | Khoche et al. | |
| 6,675,336 B1 * | 1/2004 | Thakur et al. | 714/733 |
| 6,681,358 B1 | 1/2004 | Karimi et al. | |
| 7,034,560 B2 | 4/2006 | Farnworth et al. | |
| 7,365,554 B2 * | 4/2008 | Vollrath et al. | 324/763 |
| 2003/0137308 A1 | 7/2003 | Wang | |
| 2005/0213269 A1 | 9/2005 | Vollrath et al. | |
| 2005/0229054 A1 | 10/2005 | Von Campenhausen et al. | |
| 2005/0251713 A1 | 11/2005 | Lee | |

FOREIGN PATENT DOCUMENTS

| | | |
|---|---|---|
| JP | 8-137824 | 5/1996 |
| JP | 9-26463 | 1/1997 |
| JP | 2001-296337 | 10/2001 |
| JP | 2002-022803 | 1/2002 |
| JP | 2003-84044 | 3/2003 |
| JP | 2005-322375 | 11/2005 |
| KR | 10-2000-0066527 A | 11/2000 |
| KR | 10-2005-0121376 | 12/2005 |
| KR | 10-0728564 B1 | 6/2007 |
| KR | 1020080060340 A | 7/2008 |

OTHER PUBLICATIONS

Notice of Allowance issued from Korean Intellectual Property Office on Mar. 13, 2009 with an English Translation.
Korean Office Action, with English Translation, issued in Korean Patent Application No. KR 10-2007-0098270, dated Oct. 28, 2008.
Korean Notice of Allowance issued in Korean Patent Application No. KR 10-2006-0134300, mailed Jul. 25, 2008.
Notice of Preliminary Rejection issued from State Intellectual Property Office of People's Republic of China on May 24, 2010.

* cited by examiner

*Primary Examiner*—Minh N Tang
(74) *Attorney, Agent, or Firm*—IP & T Group LLP

(57) ABSTRACT

A semiconductor device includes: a plurality of pins for receiving a plurality of external mount test signals; and a signal generating unit for generating a plurality of internal test mode signals in response the external mount test signals, wherein the semiconductor device enters into a mount test mode in response to the internal test mode signals for evaluating an operation of the semiconductor device mounted on an actual application device.

20 Claims, 6 Drawing Sheets

SEMICONDUCTOR DEVICE FOR PERFORMING MOUNT TEST IN RESPONSE TO INTERNAL TEST MODE SIGNALS

CROSS-REFERENCES TO RELATED APPLICATION

The present invention claims priority of Korean patent application numbers 10-2006-0134300 & 10-2007-0098270, filed on Dec. 27, 2006 & Sep. 28, 2007, which are incorporated by reference in their entirety.

BACKGROUND OF THE INVENTION

The present invention relates to semiconductor design technologies, and more particularly, to a mount test of a semiconductor device.

As well-known in the art, the mount test is to verify the operation of a semiconductor device by configuring a single semiconductor device or a plurality of semiconductor devices in the form of modules that are standardized configuration units and connecting them to an actual application device.

This test differs from a general test which detects a defect or failure of a semiconductor device through the use of a tester having a user test program set by the user.

Therefore, it is not possible to apply the user test program set by the user in the mount test.

In this circumstance, there may be many defects due to a mutual collision problem between an actual external controller of the actual application device and a semiconductor device. It also may be difficult for a general purpose tester to consider the environmental causes such as mutual collision problem and, therefore, to perform a failure analysis correctly.

SUMMARY OF THE INVENTION

Embodiments of the present invention are directed to providing a semiconductor device to perform a mount test mode for testing an operation of the semiconductor device mounted on an actual application device.

Embodiments of the present invention are directed to providing a semiconductor device capable of varying internal characteristics of the semiconductor device mounted on an actual application device.

Embodiments of the present invention are directed to providing a semiconductor device to enter a test mode in response to a mount test signal inputted from external mounted on an actual application device.

In accordance with a first aspect of the present invention, there is provided a semiconductor device, including: a plurality of pins for receiving a plurality of external mount test signals; and a signal generating unit for generating a plurality of internal test mode signals in response to voltage levels of the external mount test signals, wherein the semiconductor device enters into a mount test mode in response to the internal test mode signals for evaluating an operation of the semiconductor device mounted on an actual application device.

In accordance with a second aspect of the present invention, there is provided a semiconductor device, including: a signal generating unit for generating a plurality of internal test mode signals in response to voltage levels of an external mount test signals; and a decoding unit for decoding the plurality of internal test mode signals, wherein the semiconductor device enters into a mount test mode in response to the internal test mode signals for evaluating an operation of the semiconductor device mounted on an actual application device.

In accordance with a third aspect of the present invention, there is provided a method for testing a semiconductor device, including: receiving a plurality of external mount test signals through a plurality of pins; comparing the mount test signals with a plurality of preset reference voltages having various voltage levels; and generating a plurality of internal test mode signals in response to the comparison result, wherein the semiconductor device enters into a mount test mode in response to the internal test mode signals for evaluating an operation of the semiconductor device mounted on an actual application device.

In accordance with a fourth aspect of the present invention, there is provided a method for testing a semiconductor device, including: receiving a plurality of external mount test signals; comparing the mount test signals with a plurality of preset reference voltages having various voltage levels; and generating a plurality of internal test mode signals in response to the comparison result, wherein the semiconductor device enters into a mount test mode in response to the internal test mode signals for evaluating an operation of the semiconductor device mounted on an actual application device.

In accordance with a fifth aspect of the present invention, there is provided a semiconductor device including: a pin; a first comparator for comparing a signal from the pin and a first reference signal; and a second comparator for comparing the signal from the pin and a second reference signal.

DESCRIPTION OF SPECIFIC EMBODIMENTS

As will be set forth below, the present invention inputs a signal for entering of a semiconductor device into a test mode to an unused pin of a chip in order to change or test environment of the semiconductor device under a mount state.

Hereinafter, a preferred embodiment of the present invention will be described in detail with reference to the accompanying drawings so that the invention can be easily carried out by those skilled in the art.

Figure 1:
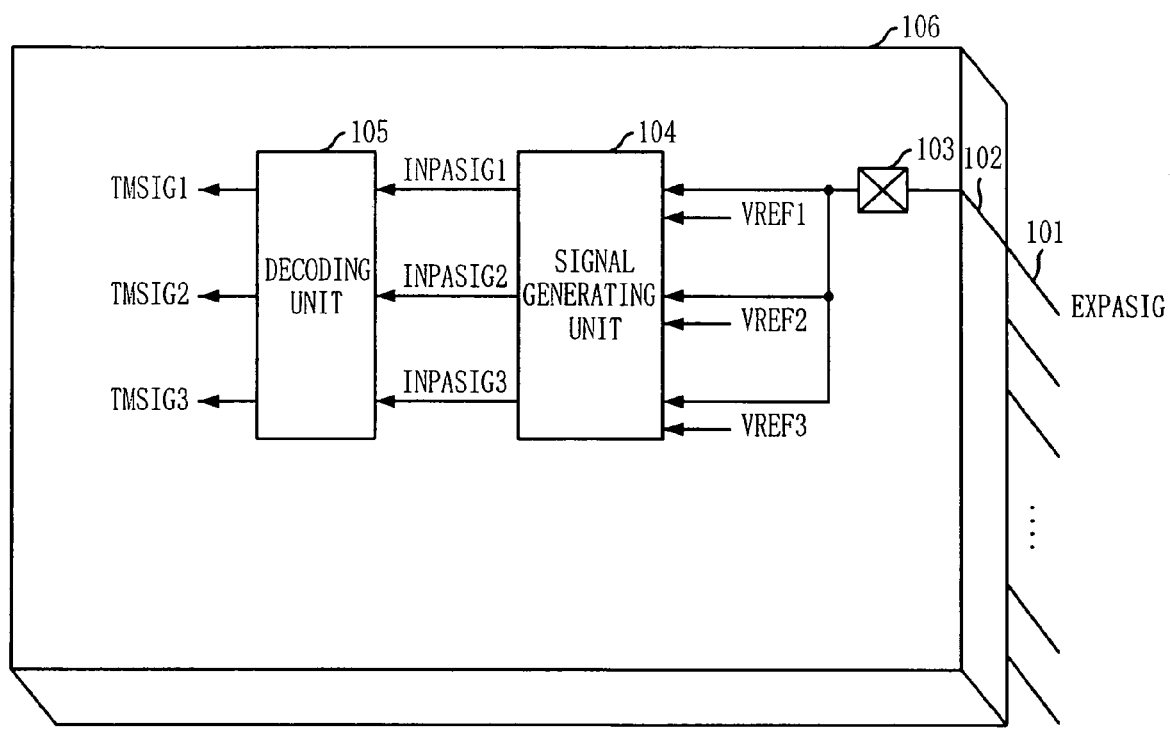
FIG. 1 is a schematic diagram illustrating a semiconductor device to perform a mount test in accordance with a first embodiment of the present invention.

FIG. 1 is a block diagram illustrating a structure of a semiconductor device to perform a mount test in accordance with a first embodiment of the present invention.

Referring to FIG. 1, the semiconductor device that performs the mount test includes a signal generating unit 104 and a decoding unit 105 in a chip 106. The signal generating unit 104 generates a plurality of internal mount test signals INPASIG1 to INPASIG3 in response to a logic level of a mount test signal EXPASIG provided from external. The decoding unit 105 decodes the plurality of internal mount test signals INPASIG1 to INPASIG3 to output a plurality of internal test mode signals TMSIG1 to TMSIG3.

The chip 106 utilizes an arbitrary pad 103 for taking the external mount test signal EXPASIG and an arbitrary pin 101, both of which are wire-bonded.

Figure 2:
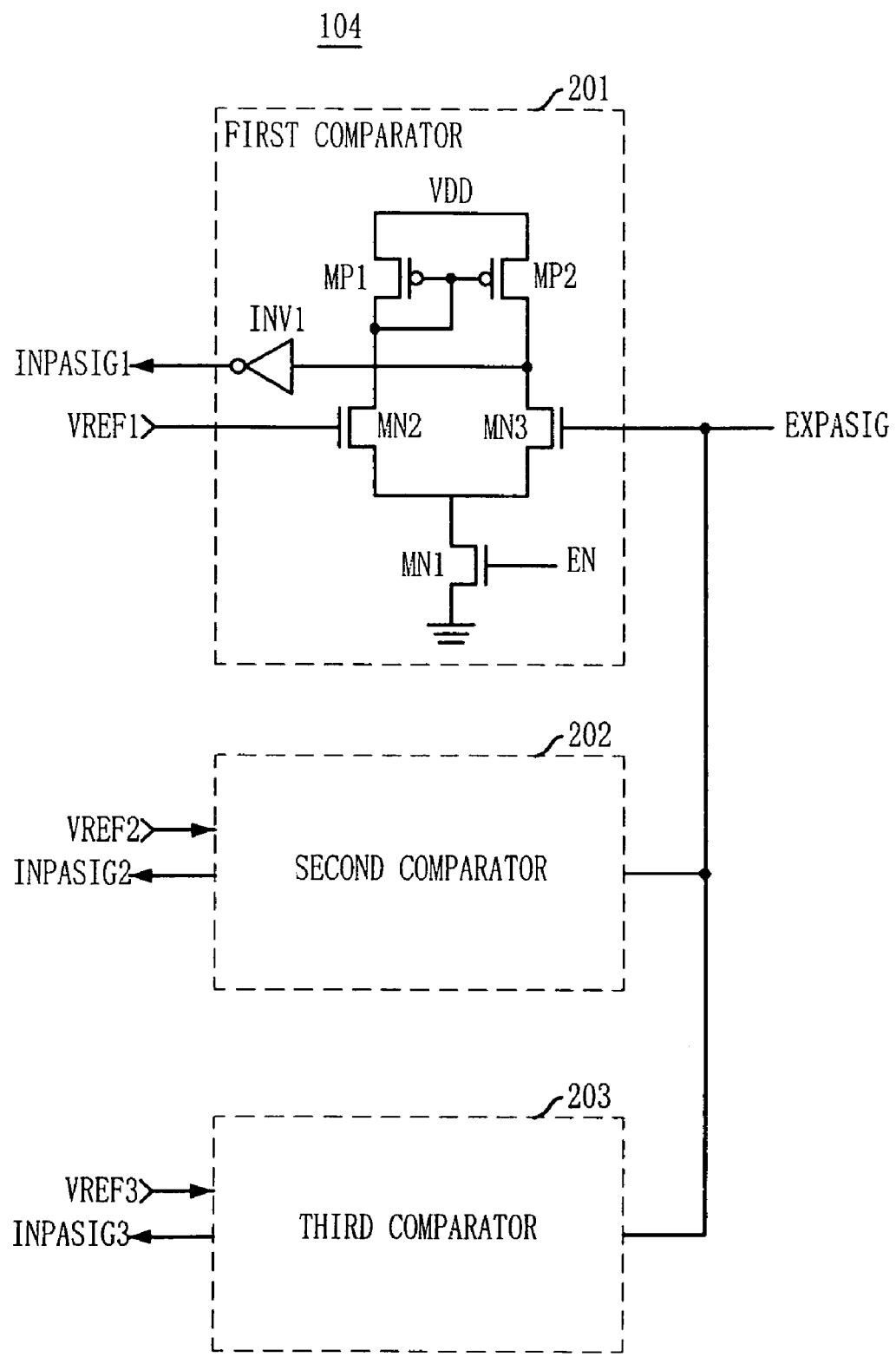
FIG. 2 describes a detailed circuit diagram illustrating one example of a signal generating unit shown in FIG. 1.

FIG. 2 describes a detailed circuit diagram illustrating one example of the signal generating unit 104 shown in FIG. 1 by referring to the reference numerals given therein.

Referring to FIG. 2, the signal generating unit 104 is provided with a plurality of comparators 201 to 203, each of which receives the external mount test signal EXPASIG and outputs a corresponding one of the plurality of internal mount test signals INPASIG1 to INPASIG3 in response to a logic level of the external mount test signal EXPASIG.

The plurality of comparator 201 to 203 have the same structure, and therefore, one of them, the first comparator 201, will be illustratively described below.

The first comparator 201 may be implemented by using a plurality of NMOS transistors MN1 to MN3, a plurality of PMOS transistors MP1 and MP2, and an inverter INV1. In operation, in response to an enable signal EN, the enable NMOS transistor MN1 is first turned on to operate the first comparator 201.

Then, a preset reference voltage VREF1 is applied to the gate of the first NMOS transistor MN2 and the external mount test signal EXPASIG is applied to the gate of the second NMOS transistor MN3. At this time, the first or second NMOS transistor MN2 or MN3 is selectively turned on depending on whether the logic level of each of the first preset reference voltage VREF1 and the external mount test signal EXPASIG is high or low.

In a first case, if it is assumed that the logic level of the external mount test signal EXPASIG is higher than that of the first preset reference voltage VREF1, the second NMOS transistor MN3 is turned on and thus the first comparator 201 finally outputs the first internal mount test signal INPASIG1 of logic high level.

In a second case, if it is assumed that the logic level of the external mount test signal EXPASIG is less than that of the first preset reference voltage VREF1, the first NMOS transistor MN2 is turned on and thus the two PMOS transistors MP1 and MP2 are turned on. Due to the turn-on of these two PMOS transistors MP1 and MP2, the first comparator 201 finally outputs the first internal mount test signal INPASIG1 of logic low level.

Here, the plurality of comparators 201 to 203 presented within the signal generating unit 104 accept different levels of reference voltages VREF1 to VREF3, while taking the same mount test signal EXPASIG as inputs.

Thus, the logic levels of the internal mount test signals INPASIG1 to INPASIG3 outputted from each of the comparators 201 to 203 may be the same as or different from each other depending on the reference voltages VREF1 to VREF3 applied thereto.

Figure 3:
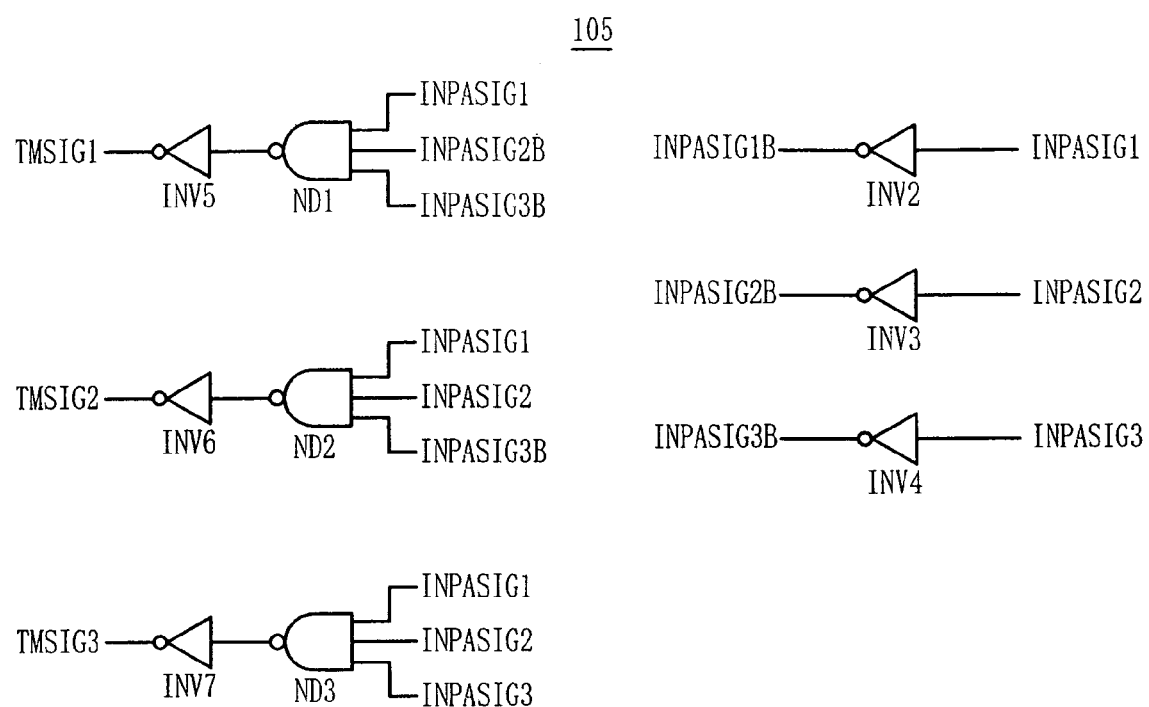
FIG. 3 describes a detailed circuit diagram illustrating one example of a decoder shown in FIG. 1.

FIG. 3 illustrates a detailed circuit diagram showing one example of the decoding unit 105 in FIG. 1 by referring to the reference numerals given therein.

Referring to FIG. 3, the decoding unit 105 is provided with a plurality of inverters INV2 to INV7 and a plurality of NAND gates ND1 to ND3 for decoding the plurality of internal mount test signals INPASIG1 to INPASIG3 outputted from the signal generating unit 104.

The decoding unit 105 logically combines the logic levels of the plurality of internal mount test signals INPASIG1 to INPASIG3 being inputted thereto, to generate test mode signals TMSIG1 to TMSIG3.

In case of a mount test tAC (access time), one example of the test mode of the semiconductor device, it is first assumed that the reference voltages VREF1 to VREF3 have an inequality of VREF1<VREF2<VREF3 in voltage level. Further, there may be a state that the semiconductor device is normally operating prior to inputting the external mount test signal EXPASIG to the chip 106, or the external mount test signal EXPASIG may be inputted to the semiconductor device that is normally operating.

First of all, in case of doing no mount test (tAC test), if the logic level of the external mount test signal EXPASIG being inputted is less than the first reference voltage VREF1, the internal test mode signals TMSIG1 to TMSIG3 are inactivated.

Further, as a first variation of the mount test (tAC test), if the logic level of the external mount test signal EXPASIG is higher than the first reference voltage VREF1 but less than the second reference voltage VREF2, the first internal test mode signal TMSIG1 is activated and the second and third internal test mode signals TMSIG2 and TMSIG3 are inactivated.

In addition, as a second variation of the mount test (tAC test), if the logic level of the external mount test signal EXPASIG is higher than the second reference voltage VREF2 but less than the third reference voltage VREF3, the first and the second internal test mode signals TMSIG1 and TMSIG2 are activated and the third internal test mode signal TMSIG3 is inactivated.

Lastly, as a third variation of the mount test (tAC test), if the logic level of the external mount test signal EXPASIG is higher than all of the reference voltages VREF1 to VREF3, the internal test mode signals TMSIG1 to TMSIG3 are all activated.

Based on the logic levels of the internal test mode signals TMSIG1 to TMSIG3 outputted to comply with each of the above variations, the semiconductor device adjusts the mount test tAC by controlling an amount of replica delay of its own delay lock loop (DLL). For example, for the first variation, the first internal test mode signal TMSIG1 is activated to increase the amount of replica delay. For the third variation, the internal test mode signals TMSIG1 to TMSIG3 are all activated to decrease the amount of replica delay.

In accordance with the invention, it is possible to monitor the semiconductor device that allows the amount of replica delay to be increased or decreased in this manner by observing a variation of data output (DQ) waveform.

Since this embodiment employs the three comparators 201 to 203, there was an illustrative explanation for the mount test (tAC test) with a total four kinds of variations. However, this is merely one embodiment, and thus, if more variations are required, it would be possible to accomplish the purpose by including more comparators and decoders accordingly.

To summarize the embodiment of the present invention referring to FIG. 1, the external mount test signal EXPASIG applied via the arbitrary pin 101 is delivered to the signal generating unit 104 by way of the arbitrary pad 103. Then, the signal generating unit 104 outputs the plurality of internal mount test signals INPASIG1 to INPASIG3 depending on the voltage level of the external mount test signal EXPASIG. The decoding unit 105 decodes the plurality of internal mount test signals INPASIG1 to INPASIG3 to generate the plurality of test mode signals TMSIG1 to TMSIG3.

Here, the voltage level of the external mount test signal EXPASIG applied the chip 106 has to be set to a value that is suitable for a desired test setting in advance.

Further, the desired test mode environment (representing the test mode environment that also enables a fine test depending on the number of test mode signals) can be changed based on the number of the output signals of the signal generating unit 104 and of decoders in the decoding unit 105.

Figure 4:
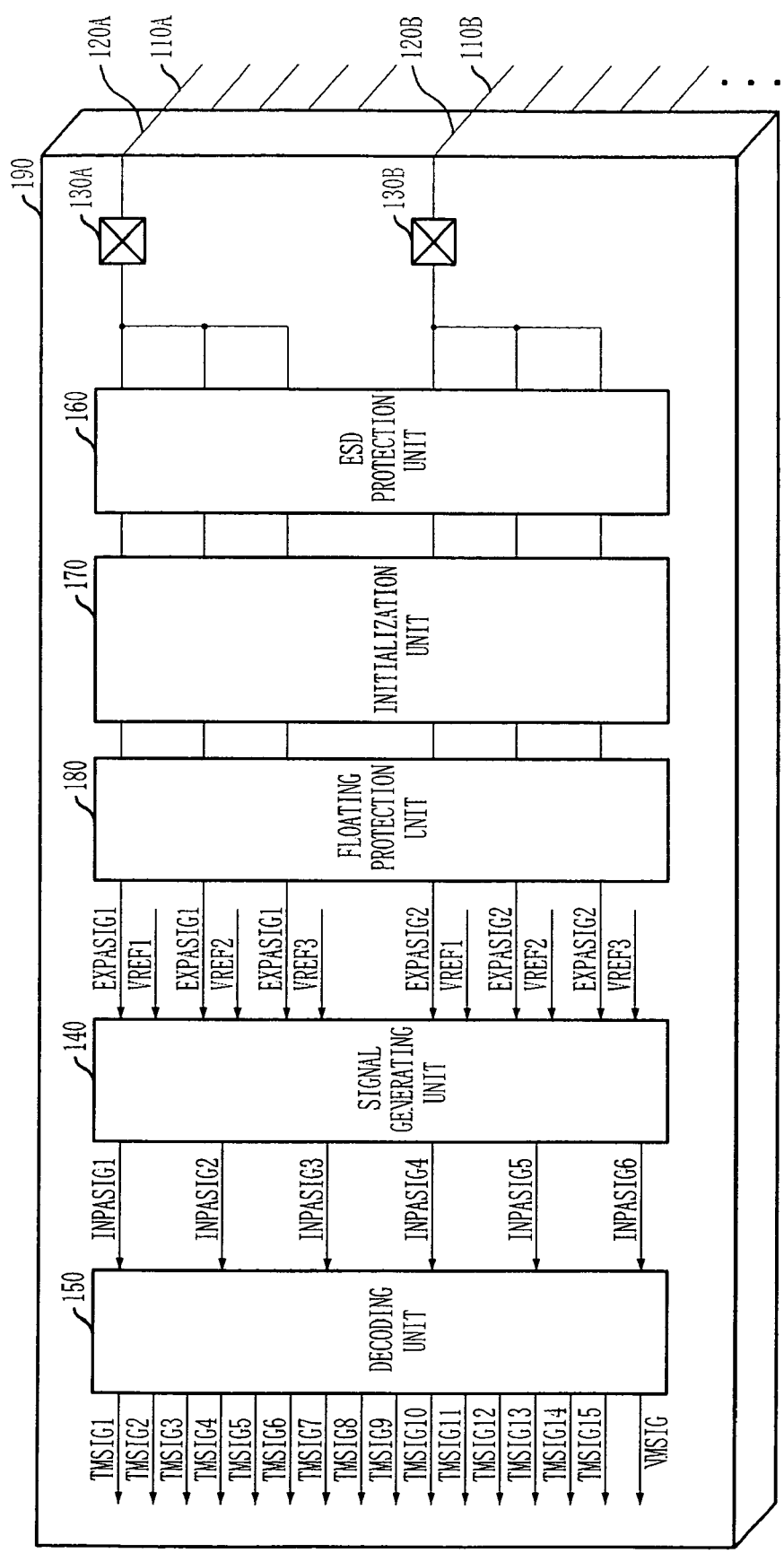
FIG. 4 is a schematic diagram illustrating a semiconductor device to perform a mount test in accordance with a second embodiment of the present invention.

FIG. 4 is a block diagram illustrating a structure of a semiconductor device to perform a mount test in accordance with a second embodiment of the present invention.

Referring to FIG. 4, the semiconductor device that performs the mount test includes a plurality of arbitrary pins 110A and 110B and a signal generating unit 140 in a chip 190. The plurality of arbitrary pins 110A and 110B receives a plurality of external mount test signals EXPASIG1 and EXPASIG2 to internal of the chip 190. The signal generating unit 140 generates a plurality of internal mount test signals INPASIG1 to INPASIG6 in response to logic levels of the external mount test signals EXPASIG1 and EXPASIG2.

The semiconductor device further includes a decoding unit 150, an electrostatic discharge (ESD) protection unit 160, an initialization unit 170, and a floating protection unit 180. The decoding unit 150 decodes the plurality of internal mount test signals INPASIG1 to INPASIG6 to output a plurality of internal test mode signals TMSIG1 to TMSIG15. The ESD protection unit 160 prevents an ESD of the arbitrary pins 110A and 110B. The initialization unit 170 initializes voltage levels at the arbitrary pins 110A and 110B during a preset initial operation of the semiconductor device. The floating protection unit 180 prevents the voltage levels at the arbitrary pins 110A and 110B from floating.

Furthermore, the semiconductor device includes a plurality of arbitrary pads 130A and 130B which are wire-bonded with the arbitrary pins 110A and 110B for transferring the external mount test signals EXPASIG1 and EXPASIG2 to the signal generating unit 140.

Figure 5:
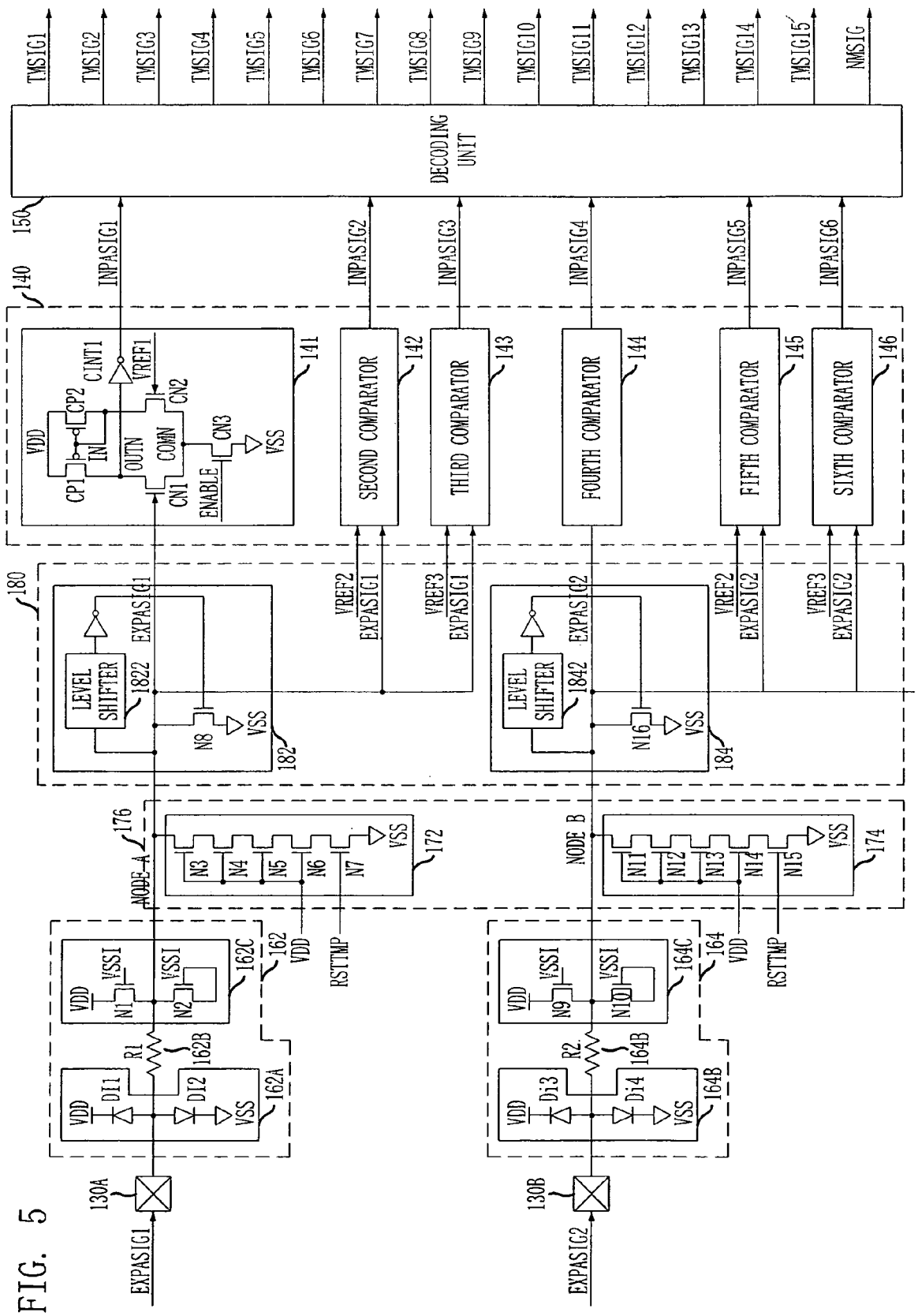
FIG. 5 describes a detailed circuit diagram of the semiconductor device shown in FIG. 4.

FIG. 5 describes a detailed circuit diagram of the semiconductor device shown in FIG. 4 by referring to the reference numerals given therein.

Referring to FIG. 5, the signal generating unit 140 is provided with a plurality of comparators 141 to 146 which compare the external mount test signals EXPASIG1 to EXPASIG2 with a plurality of preset reference voltages VREF1 to VREF3. In detail, each of comparators 141 to 146 compares a corresponding one of the external mount test signals EXPASIG1 to EXPASIG2 with a corresponding one of the preset reference voltages VREF1 to VREF3 to output a corresponding one of the internal mount test signals INPASIG1 to INPASIG6 in response to the comparison result.

The plurality of comparators 141 to 146 receives one of the preset reference voltages VREF1 to VREF3 different from each other according to the inputted external mount test signals EXPASIG1 to EXPASIG2. For example, first to third comparators 141 to 143 receiving the first external mount test signal EXPASIG1 are configured to receive the preset reference voltages VREF1 to VREF3 different from each other. Likewise, fourth to sixth comparators 144 to 146 receiving a second external mount test signal EXPASIG2 are configured to receive the preset reference voltages VREF1 to VREF3 different from each other.

Accordingly, the plurality of comparators 141 to 146 compare all of the inputted external mount test signal EXPASIG2 with all of the preset reference voltages VREF1 to VREF3.

The plurality of comparator 141 to 146 have the same structure, and therefore, one of them, the first comparator 141, will be illustratively described below.

The first comparator 141 may be implemented with first to third NMOS transistors CN1 to CN3, first and second PMOS transistors CP1 and CP2, and an inverter CINT1.

The first NMOS transistor CN1 includes a gate receiving the first external mount test signal EXPASIG1 and a drain-source path between an output node OUTN and a common node COMN to thereby control current amount flowing on its drain-source path in response to a voltage level of the first external mount test signal EXPASIG1. The second NMOS transistor CN2 includes a gate receiving the first reference voltage VREF1 and a drain-source path between a driving node IN and a common node COMN to thereby control current amount flowing on its drain-source path in response to a voltage level of the first preset reference voltage VREF1. The first and second PMOS transistors CP1 and CP2 form a current mirror between a supply voltage (VDD) terminal and one of the output node OUTN and the driving node IN to thereby make current amount flowing on the output node OUTN be substantially the same as that flowing on the driving node IN. The third NMOS transistor CN3 includes a gate receiving an enable signal ENABLE and a drain-source path between the common node COMN and a ground voltage (VSS) terminal to thereby control connection or disconnection of its drain-source path in response to the enable signal ENABLE. The inverter CINT1 determines and outputs a logic level of the first internal mount test signal INPASIG1 in response to a voltage level of the output node OUTN.

Upon operation, in response to the enable signal ENABLE, the third NMOS transistor CN3 is turned on to operate the first comparator 141.

Then, the first external mount test signal EXPASIG1 is applied to the gate of the first NMOS transistor CN1 and the first preset reference voltage VREF1 is applied to the gate of the second NMOS transistor CN2. At this time, the logic level of the first internal mount test signal INPASIG1 outputted from the first comparator 141 is determined depending on whether the logic level of each of the first preset reference voltage VREF1 and the first external mount test signal EXPASIG1 is high or low.

In a first case, it is assumed that the logic level of the external mount test signal EXPASIG1 applied to the gate of the first NMOS transistor CN1 is higher than that of the first preset reference voltage VREF1 applied to the gate of the second NMOS transistor CN2. At this time, the current amount flowing on the drain-source path of the first NMOS transistor CN1 is larger than that of the second NMOS transistor CN2. The first and second PMOS transistors CP1 and CP2 forming the current mirror try to make the current amount flowing on the output node OUTN be substantially the same as that flowing on the driving node IN. Accordingly, a voltage level of the output node OUTN becomes lower and a voltage level of the driving node IN becomes higher. The inverter CINT1 finally outputs the first internal mount test signal INPASIG1 with a logic high level according as the voltage level of the output node OUTN becomes lower.

In a second case, it is assumed that the logic level of the external mount test signal EXPASIG1 applied to the gate of the first NMOS transistor CN1 is lower than that of the first preset reference voltage VREF1 applied to the gate of the second NMOS transistor CN2. At this time, the current amount flowing on the drain-source path of the second NMOS transistor CN2 is larger than that of the first NMOS transistor CN1. The first and second PMOS transistors CP1 and CP2 try to make the current amount flowing on the output node OUTN be substantially the same as that flowing on the driving node IN. Accordingly, a voltage level of the output node OUTN becomes higher and a voltage level of the driving node IN becomes lower. The inverter CINT1 finally outputs the first internal mount test signal INPASIG1 with a logic low level according as the voltage level of the output node OUTN becomes higher.

Here, the other comparators 142 to 146 have substantially the same structure as that of the first comparator 141, and perform substantially the same operation as that of the first comparator 141. Referring to table. 1, voltage levels of the external mount test signals EXPASIG1 to EXPASIG3, the preset reference voltages VREF1 to VREF3, and the internal mount test signals INPASIG1 to INPASIG6 according to the comparators 141 to 146 will be described below.

voltage VDD so as to prevent current consumption when the reset pulse RSTTMP is toggled after the supply voltage VDD is applied.

The second initializing circuit 174 includes a plurality of initializing NMOS transistors N11 to N15 coupled between a second node NODEB and the ground voltage (VSS) terminal in series. The second node NODEB is coupled to the second arbitrary pad 130B. The tenth initializing NMOS transistor N15 having a source coupled to the ground voltage (VSS) terminal includes a gate receiving the reset pulse RSTTMP so that the second initializing circuit 174 is turned on or off in

TABLE 1

| external mount test signals | | preset reference voltages | | | | | |
| --- | --- | --- | --- | --- | --- | --- | --- |
| EXPASIG1 | EXPASIG2 | VREF1 = 1.0 V | | VREF2 = 1.5 V | | VREF3 = 2.0 V | |
| 0.75 V | 0.75 V | INPASIG1 = LOW | INPASIG4 = LOW | INPASIG2 = LOW | INPASIG5 = LOW | INPASIG3 = LOW | INPASIG6 = LOW |
| 1.25 V | 1.25 V | INPASIG1 = HIGH | INPASIG4 = HIGH | INPASIG2 = LOW | INPASIG5 = LOW | INPASIG3 = LOW | INPASIG6 = LOW |
| 1.75 V | 1.75 V | INPASIG1 = HIGH | INPASIG4 = HIGH | INPASIG2 = HIGH | INPASIG5 = HIGH | INPASIG3 = LOW | INPASIG6 = LOW |
| 2.25 V | 2.25 V | INPASIG1 = HIGH | INPASIG4 = HIGH | INPASIG2 = HIGH | INPASIG5 = HIGH | INPASIG3 = HIGH | INPASIG6 = HIGH |

The ESD protection unit 160 includes a plurality of ESD protectors 162 and 164, each of which is connected to one of the arbitrary pads 130A and 130B to thereby prevent the ESD of the arbitrary pins 110A and 110B.

The first ESD protector 162 includes first to third protecting circuits 162A to 162C. The first protecting circuit 162A is implemented with first and second diodes DI1 and DI2 connected between the supply voltage (VDD) terminal and the ground voltage (VSS) terminal in series. The second protecting circuit 162B is implemented with a first resistor R1. The third protecting circuit 162C is implemented with first and second protecting MOS transistors N1 and N2.

The second ESD protector 164 includes fourth to sixth protecting circuits 164A to 164C. The fourth protecting circuit 164A is implemented with third and fourth diodes DI3 and DI4 connected between the supply voltage (VDD) terminal and the ground voltage (VSS) terminal in series. The fifth protecting circuit 164B is implemented with a second resistor R2. The sixth protecting circuit 164C is implemented with third and fourth protecting MOS transistors N9 and N10.

The initialization unit 170 includes a plurality of initializing circuits 172 and 174, each of which is connected to one of the arbitrary pads 130A and 130B to thereby initialize the voltage levels at the arbitrary pins 110A and 110B during the preset initial operation of the semiconductor device. Herein, each of the initializing circuits 172 and 174 is controlled in response to a reset pulse RSTTMP which is toggled at the preset initial operation of the semiconductor device.

The first initializing circuit 172 includes a plurality of initializing NMOS transistors N3 to N7 coupled between a first node NODEA and the ground voltage (VSS) terminal in series. The first node NODEA is coupled to the first arbitrary pad 130A. The fifth initializing NMOS transistor N7 having a source coupled to the ground voltage (VSS) terminal includes a gate receiving the reset pulse RSTTMP so that the first initializing circuit 172 is turned on or off in response to the reset pulse RSTTMP. Further, the first to fourth initializing NMOS transistors N3 to N6 includes a gate receiving a supply response to the reset pulse RSTTMP. Further, the sixth to ninth initializing NMOS transistors N11 to N14 includes a gate receiving the supply voltage VDD so as to prevent current consumption when the reset pulse RSTTMP is toggled after the supply voltage VDD is applied.

The floating protection unit 180 includes a plurality of floating protectors 182 and 184, each of which is connected to one of the arbitrary pads 130A and 130B so as not to transfer an inputted signal to the signal generating unit 140 when the signal inputted through the arbitrary pads 130A and 130B does not have a predetermined voltage level. Herein, each of the floating protectors 182 and 184 can cut off transferring the unacquainted inputted signal to the signal generating unit 140 through the arbitrary pads 130A and 130B by pull-down driving the first and second nodes NODEA and NODEB which are one to one coupled to the first and second arbitrary pads 130A and 130B.

The first floating protector 182 includes a first level shifter 1822 and a first pull-down driver N8. The first floating protector 182 turns off the first pull-down driver N8 when a signal whose voltage level does not vary during a predetermined time is inputted through the first arbitrary pad 130A. On the contrary, the first floating protector 182 turns on the first pull-down driver N8 when a signal whose voltage level consecutively varies is inputted through the first arbitrary pad 130A. Herein, the first pull-down driver N8 includes a drain-source path coupled between the ground voltage (VSS) terminal and the first nodes NODEA to thereby connect or disconnect its drain-source path in response to an output of the first level shifter 1822.

The second floating protector 184 includes a first level shifter 1842 and a second pull-down driver N16. The second floating protector 184 turns off the second pull-down driver N16 when a signal whose voltage level does not vary during a predetermined time is inputted through the second arbitrary pad 130B. Otherwise, the second floating protector 184 turns on the second pull-down driver N16 when a signal whose voltage level consecutively varies is inputted through the second arbitrary pad 130B. Herein, the second pull-down driver N16 includes a drain-source path coupled between the ground voltage (VSS) terminal and the second nodes NODEB to thereby connect or disconnect its drain-source path in response to an output of the second level shifter 1842.

Figure 6:
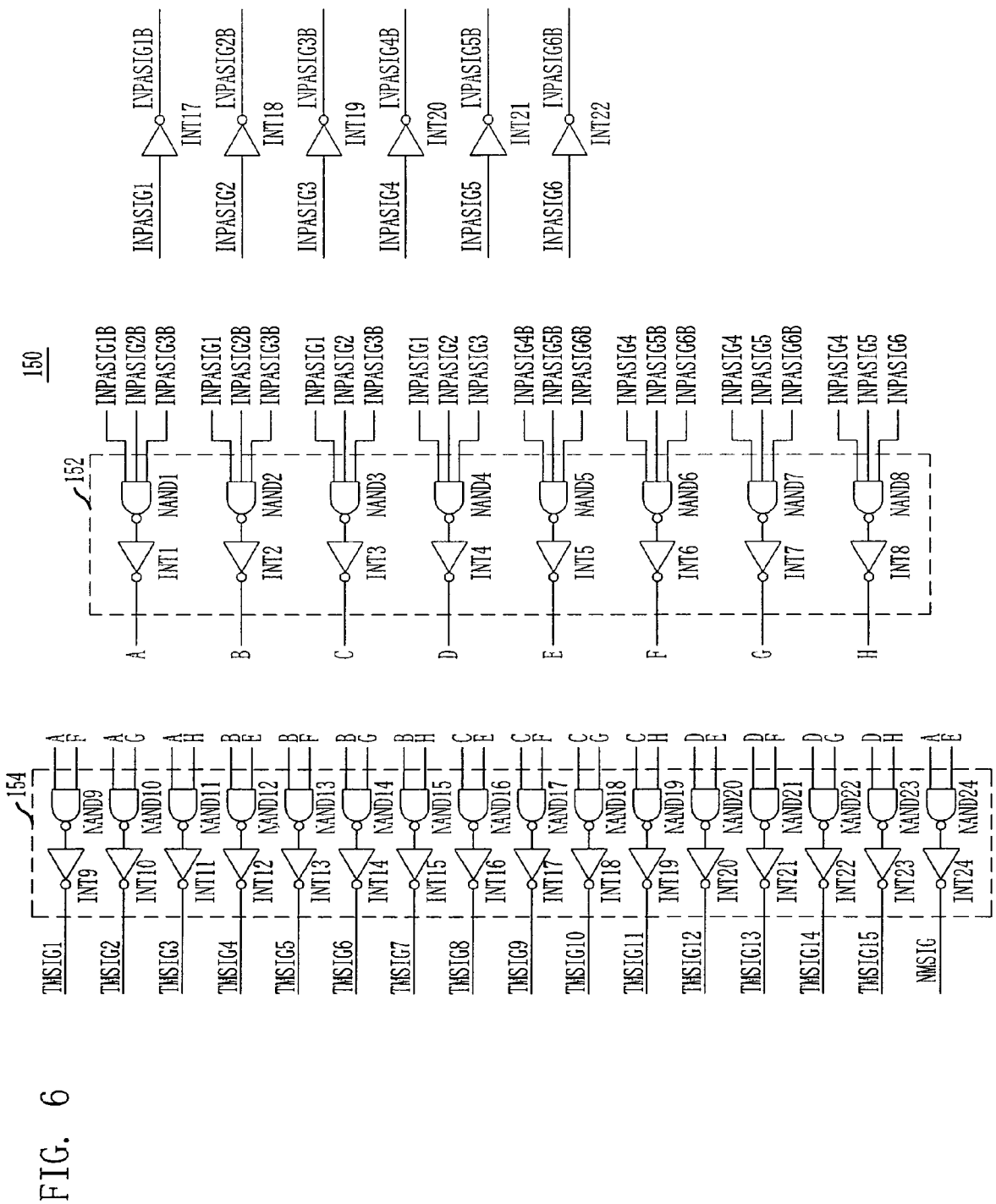
FIG. 6 describes a detailed circuit diagram illustrating one example of a decoder shown in FIGS. 4 and 6.

FIG. 6 illustrates a detailed circuit diagram showing one example of the decoding unit 150 in FIGS. 4 and 5 by referring to the reference numerals given therein.

Referring to FIG. 6, the decoding unit 150 includes first and second decoders 152 and 154.

The first decoder 152 is provided with a plurality of inverters INT1 to INT8 and a plurality of NAND gates NAND1 to NAND8 for decoding the plurality of internal mount test signals INPASIG1 to INPASIG6 to generate a plurality of decoding signals A to H.

In detail, if all the internal mount test signals INPASIG1 to INPASIG6 have a logic low level, the first and fifth decoding signals A and E become a logic high level and the other decoding signals B, C, D, F, G, and H become a logic low level.

If the first and fourth internal mount test signals INPASIG1 and INPASIG4 have a logic high level and the other internal mount test signals INPASIG2, INPASIG3, INPASIG5 and INPASIG6, the second and sixth decoding signals B and F become a logic high level and the other decoding signals A, C, D, E, G, and H become a logic low level.

If the third and sixth internal mount test signals INPASIG3 and INPASIG6 have a logic high level and the other internal mount test signals INPASIG1, INPASIG2, INPASIG4 and INPASIG5, the third and seventh decoding signals C and G become a logic high level and the other decoding signals A, B, D, E, F, and H become a logic low level.

If all the internal mount test signals INPASIG1 to INPASIG6 have a logic high level, the fourth and eighth decoding signals D and H become a logic high level and the other decoding signals A, B, C, E, F, and G become a logic low level.

The second decoder 154 is provided with a plurality of inverters INT9 to INT24 and a plurality of NAND gates NAND9 to NAND24 for decoding the plurality of decoding signals A to H to output the plurality of internal test mode signals TMSIG1 to TMSIG15.

In detail, if the first and sixth decoding signals A and F have a logic high level, the first internal test mode signal TMSIG1 becomes a logic high level and the other internal test mode signals TMSIG2 to TMSIG15 become a logic low level.

If the first and seventh decoding signals A and G have a logic high level, the second internal test mode signal TMSIG2 becomes a logic high level and the other internal test mode signals become a logic low level.

If the first and eighth decoding signals A and H have a logic high level, the third internal test mode signal TMSIG3 becomes a logic high level and the other internal test mode signals become a logic low level.

If the second and fifth decoding signals B and E have a logic high level, the fourth internal test mode signal TMSIG4 becomes a logic high level and the other internal test mode signals become a logic low level.

If the second and sixth decoding signals B and F have a logic high level, the fifth internal test mode signal TMSIG5 becomes a logic high level and the other internal test mode signals become a logic low level.

If the second and seventh decoding signals B and G have a logic high level, the sixth internal test mode signal TMSIG6 becomes a logic high level and the other internal test mode signals become a logic low level.

If the second and eighth decoding signals B and H have a logic high level, the seventh internal test mode signal TMSIG7 becomes a logic high level and the other internal test mode signals become a logic low level.

If the third and fifth decoding signals C and E have a logic high level, the eighth internal test mode signal TMSIG8 becomes a logic high level and the other internal test mode signals become a logic low level.

If the third and sixth decoding signals C and F have a logic high level, the ninth internal test mode signal TMSIG9 becomes a logic high level and the other internal test mode signals become a logic low level.

If the third and seventh decoding signals C and G have a logic high level, the tenth internal test mode signal TMSIG10 becomes a logic high level and the other internal test mode signals become a logic low level.

If the third and eighth decoding signals C and H have a logic high level, the eleventh internal test mode signal TMSIG11 becomes a logic high level and the other internal test mode signals become a logic low level.

If the fourth and fifth decoding signals D and E have a logic high level, the twelfth internal test mode signal TMSIG12 becomes a logic high level and the other internal test mode signals become a logic low level.

If the fourth and sixth decoding signals D and F have a logic high level, the thirteenth internal test mode signal TMSIG13 becomes a logic high level and the other internal test mode signals become a logic low level.

If the fourth and seventh decoding signals D and G have a logic high level, the fourteenth internal test mode signal TMSIG14 becomes a logic high level and the other internal test mode signals become a logic low level.

If the fourth and eighth decoding signals D and H have a logic high level, the fifteenth internal test mode signal TMSIG15 becomes a logic high level and the other internal test mode signals become a logic low level.

If the first and fourth decoding signals A and E have a logic high level, a normal mode signal NMSIG becomes a logic high level and all the internal test mode signals TMSIG1 to TMSIG15 become a logic low level. Herein, the normal mode signal NMSIG is activated in a normal mode when a test operation is not performed.

Referring to table. 2, voltage levels of the decoding signals A to H, and the internal test mode signals TMSIG1 to TMSIG15 according to the internal mount test signals INPASIG1 to INPASIG6 will be described below.

TABLE 2

| internal mount test signals INPASIG | | | | | | decoding signals | | | | | | | | internal test mode signals having a logic |
| --- | --- | --- | --- | --- | --- | --- | --- | --- | --- | --- | --- | --- | --- | --- |
| 6 | 5 | 4 | 3 | 2 | 1 | A | B | C | D | E | F | G | H | high level |
| L | L | L | L | L | L | H | L | L | L | H | L | L | L | NMSIG |
| L | L | L | L | L | H | L | H | L | L | H | L | L | L | TMSIG4 |
| L | L | L | L | H | H | L | L | H | L | H | L | L | L | TMSIG8 |

TABLE 2-continued

| internal mount test signals INPASIG | | | | | | decoding signals | | | | | | | | internal test mode signals having a logic high level |
|---|---|---|---|---|---|---|---|---|---|---|---|---|---|---|
| 6 | 5 | 4 | 3 | 2 | 1 | A | B | C | D | E | F | G | H | |
| L | L | L | H | H | H | L | L | L | H | H | L | L | L | TMSIG12 |
| L | L | H | L | L | L | H | L | L | L | L | H | L | L | TMSIG1 |
| L | L | H | L | L | H | L | H | L | L | L | H | L | L | TMSIG5 |
| L | L | H | L | H | H | L | L | H | L | L | H | L | L | TMSIG9 |
| L | L | H | H | H | H | L | L | L | H | L | H | L | L | TMSIG13 |
| L | H | H | L | L | L | H | L | L | L | L | L | H | L | TMSIG2 |
| L | H | H | L | L | H | L | H | L | L | L | L | H | L | TMSIG6 |
| L | H | H | L | H | H | L | L | H | L | L | L | H | L | TMSIG10 |
| L | H | H | H | H | H | L | L | L | H | L | L | H | L | TMSIG14 |
| H | H | H | L | L | L | H | L | L | L | L | L | L | H | TMSIG3 |
| H | H | H | L | L | H | L | H | L | L | L | L | L | H | TMSIG7 |
| H | H | H | L | H | H | L | L | H | L | L | L | L | H | TMSIG11 |
| H | H | H | H | H | H | L | L | L | H | L | L | L | H | TMSIG15 |

In the second embodiment, two external mount test signals EXPASIG1 and EXPASIG2 are inputted through two arbitrary pins 110A and 110B and two arbitrary pads 130A and 130B, and compared with three reference voltages VREF1 to VREF3 via six comparators 141 to 146, and thus six internal mount test signals INPASIG1 to INPASIG6 are outputted to thereby generate fifteen internal test mode signals TMSIG1 to TMSIG15 and one normal mode signal NMSIG. However, this is merely one embodiment, and thus, if more variations are required, it would be possible to accomplish the purpose by including more or less comparators and decoders accordingly.

For example, a method for making the number of the internal mount test signals be twice can be described as follows.

First, it is possible to make the number of the reference voltages be twice, i.e., six reference voltages not three reference voltages. Accordingly, the number of the internal mount test signals can be twice.

Second, it is possible to make the number of arbitrary pins and pads be twice, i.e., four pins and pads not two pins and pads. Accordingly, four external mount test signals can be inputted and thus the number of the internal mount test signals can be twice with three reference voltages.

In case of the first method, because the supply voltage VDD is fixed, an interval of the reference voltages can be narrow. For example, it is assumed that the interval of three reference voltages is 0.5 V. If making the number of the reference voltages to be five, the interval of five reference voltages is 0.25 V. In actual device, it is difficult to make the plurality of reference voltages having the interval of 0.25 V. In case of the second method, because of maintaining the number of the reference voltages, i.e., three, the above matter of the first method is not happened.

Even though the types and arrangements of logic gates in the preferred embodiment set forth above are illustrated with respect to the case the input and output signals used therein are all high active signals, it should be noted that these logic gates may be implemented in different types and arrangements based on the active polarities of the input and output signals.

As mentioned above, the present invention can change the environments of the semiconductor device under the mount state or test the semiconductor device.

As a result, the present invention helps the analysis of the semiconductor device under the mount state, thereby reducing a period of term taken for product development and also quickly coping with the dissatisfaction of customers.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a plurality of pins for receiving a plurality of external mount test signals;
a signal generating unit for generating a plurality of internal test mode signals in response to the external mount test signals, and
a decoding unit for decoding the plurality of internal test mode signals,
wherein the semiconductor device enters into a mount test mode, in response to the internal test mode signals, for evaluating an operation of the semiconductor device in a mounted state.

2. The semiconductor device as recited in claim 1, wherein the signal generating unit generates the plurality of internal test mode signals in response to voltage levels of the external mount test signals.

3. The semiconductor device as recited in claim 1, further comprising a plurality of pads for connecting the plurality of pins with the signal generating unit.

4. The semiconductor device as recited in claim 1, further comprising an electrostatic discharge (ESD) protection unit for preventing an ESD of the pins.

5. The semiconductor device as recited in claim 1, further comprising an initialization unit for initializing voltage levels at the pins during a preset initial operation of the semiconductor device.

6. The semiconductor device as recited in claim 1, further comprising a floating protection unit for preventing voltage levels at the pins from floating.

7. The semiconductor device as recited in claim 1, wherein the signal generating unit includes a plurality of comparators for comparing the mount test signals with a plurality of preset reference voltages having various voltage levels.

8. A semiconductor device, comprising:
a signal generating unit for generating a plurality of internal test mode signals in response to an external mount test signal; and
a decoding unit for decoding the plurality of internal test mode signals, wherein the semiconductor device enters into a mount test mode, in response to the internal test mode signals, for evaluating an operation of the semiconductor device in a mounted state.

9. The semiconductor device as recited in claim 8, wherein the signal generating unit generates the plurality of internal test mode signals in response to a voltage level of the external mount test signal.

10. The semiconductor device as recited in claim 8, further comprising an initialization unit for initializing the signal generating unit during a preset initial operation of the semiconductor device.

11. The semiconductor device as recited in claim 8, wherein the signal generating unit includes a plurality of comparators for comparing the mount test signals with a plurality of preset reference voltages having various voltage levels.

12. A method for testing a semiconductor device, comprising:
receiving a plurality of external mount test signals through a plurality of pins;
comparing the mount test signals with a plurality of preset reference voltages having various voltage levels; and
generating a plurality of internal test mode signals in response to the comparison result,
wherein the semiconductor device enters into a mount test mode, in response to the internal test mode signals, for evaluating an operation of the semiconductor device under a mount state.

13. The method as recited in claim 12, further comprising preventing an electrostatic discharge (ESD) of the plurality of pins.

14. The method as recited in claim 12, further comprising initializing voltage levels at the pins during a preset initial operation of the semiconductor device.

15. The method as recited in claim 12, further comprising preventing voltage levels at the pins from floating.

16. The method as recited in claim 12, further comprising:
decoding the plurality of internal test mode signals to output a plurality of decoding signals; and
executing a test set in response to the plurality of decoding signals.

17. A semiconductor device, comprising:
a pin;
a first comparator for comparing a signal from the pin and a first reference signal to generate a first internal test mode signal;
a second comparator for comparing the signal from the pin and a second reference signal to generate a second internal test mode signal, and
a decoding unit for decoding the internal test mode signals,
wherein the semiconductor device enters into a mount test mode, in response to the internal test mode signals, for evaluating an operation of the semiconductor device under a mount state.

18. The semiconductor device as recited in claim 17, wherein the first reference signal and the second reference signal have different voltage levels.

19. The semiconductor device as recited in claim 17, wherein the signal input from the pin is an external mount test signal.

20. The semiconductor device as recited in claim 17, wherein a plurality of internal test mode signals are generated in response to comparison results in the mount test mode.

* * * * *